(12) United States Patent
Okamoto

(10) Patent No.: US 12,318,879 B2
(45) Date of Patent: Jun. 3, 2025

(54) PRESSURIZING SUCTION-ATTACHMENT TABLE AND PRESSURIZING DEVICE EQUIPPED WITH THE SAME

(71) Applicant: KANADEVIA CORPORATION, Osaka (JP)

(72) Inventor: Kenji Okamoto, Osaka (JP)

(73) Assignee: KANADEVIA CORPORATION, Osaka (JP)

(*) Notice: Subject to any disclaimer, the term of this patent is extended or adjusted under 35 U.S.C. 154(b) by 256 days.

(21) Appl. No.: 17/927,615

(22) PCT Filed: Jun. 7, 2021

(86) PCT No.: PCT/JP2021/021601
§ 371 (c)(1),
(2) Date: Nov. 23, 2022

(87) PCT Pub. No.: WO2021/256317
PCT Pub. Date: Dec. 23, 2021

(65) Prior Publication Data
US 2023/0166370 A1    Jun. 1, 2023

(30) Foreign Application Priority Data
Jun. 18, 2020   (JP) .................................. 2020-105171

(51) Int. Cl.
*B23Q 3/08* (2006.01)
(52) U.S. Cl.
CPC ..................... *B23Q 3/088* (2013.01)
(58) Field of Classification Search
CPC .. B23Q 3/088; B23Q 2703/04; B23B 31/307; B25B 11/005; H01L 21/6835
See application file for complete search history.

(56) References Cited

U.S. PATENT DOCUMENTS 8,888,557 B2 * 11/2014 Tanaka ................ H01L 21/6838
451/388
2014/0009183 A1   1/2014 Akiyama et al.
(Continued)

FOREIGN PATENT DOCUMENTS

EP           1304728 A2 *   4/2003    ........... B24B 37/042
JP         05-344284 A      12/1993
(Continued)

OTHER PUBLICATIONS

Decision to Grant dated Jul. 10, 2023, issued in corresponding Japanese Patent Application No. 2020-105171 with English translation (5 pgs.).

(Continued)

*Primary Examiner* — C. A. Rivera
(74) *Attorney, Agent, or Firm* — Pillsbury Winthrop Shaw Pittman, LLP

(57) ABSTRACT

A pressurizing suction-attachment table comprises a porous body having a suction-attachment surface on which an object can be placed, an elastic member provided to the porous body, and a frame body supporting the porous body via the elastic member. The pressurizing suction-attachment table comprises an aspirator capable of aspirating an aspiration space formed between the porous body and the frame body to cause the object to be suction-attached to the suction-attachment surface. The porous body includes an opposite surface positioned on a side opposite to the suction-attachment surface. The frame body includes a receiving surface for receiving the opposite surface when the elastic member is elastically deformed due to pressurizing the object on the suction-attachment surface thereto. The pressurizing suction-attachment table is configured such that, when the opposite surface is received by the receiving (Continued)

surface, the porous body applies a uniform reactive force to the object being pressurized.

7 Claims, 5 Drawing Sheets

(56) References Cited

U.S. PATENT DOCUMENTS

| | | | |
|---|---|---|---|
| 2016/0276198 A1* | 9/2016 | Anada | H01L 21/6831 |
| 2017/0053822 A1* | 2/2017 | Ben Natan | H01L 21/6838 |
| 2020/0135528 A1* | 4/2020 | Shiraishi | H01L 21/68757 |
| 2020/0139731 A1 | 5/2020 | Asanuma | |

FOREIGN PATENT DOCUMENTS

| | | | | |
|---|---|---|---|---|
| JP | 09-076088 A | | 3/1997 | |
| JP | 2005-205507 A | | 8/2005 | |
| JP | 2012-213836 A | | 11/2012 | |
| JP | 2014-013802 A | | 1/2014 | |
| JP | 2014216230 A | * | 11/2014 | |
| JP | 2016-197623 A | | 11/2016 | |
| JP | 2020-075774 A | | 5/2020 | |
| KR | 10-2004-0084128 A | | 10/2004 | |
| WO | WO-2006033498 A1 | * | 3/2006 | ......... H01L 21/6838 |
| WO | WO-2019130740 A1 | * | 7/2019 | ............. B24B 37/30 |

OTHER PUBLICATIONS

International Search Report dated Jul. 13, 2022, issued in corresponding International Application No. PCT/JP2021/021601 with English translation (4 pgs.).

Written Opinion dated Jul. 13, 2022, issued in corresponding International Application No. PCT/JP2021/021601 (3 pgs.).

Extended European Search Report dated Jul. 18, 2024, issued in corresponding European Patent Application No. 21824934.0 (7 pgs.).

* cited by examiner

PRESSURIZING SUCTION-ATTACHMENT TABLE AND PRESSURIZING DEVICE EQUIPPED WITH THE SAME

CROSS-REFERENCE TO RELATED APPLICATIONS

This application is the U.S. National Stage of PCT/JP2021/021601, filed Jun. 7, 2021, which claims priority to Japanese Patent Application No. 2020-105171, filed Jun. 18, 2020, the entire contents of both of which are herein incorporated by reference in their entireties.

TECHNICAL FIELD

The present invention relates to a pressurizing suction-attachment table and a pressurizing device equipped with the same.

BACKGROUND ART

A suction-attachment table includes a suction-attachment surface on which an object such as a thin film is placed, and aspirates the object from this suction-attachment surface, thereby causing the object to be suction-attached to the suction-attachment surface. The object suction-attached to the suction-attachment surface is held in a flat manner on the suction-attachment surface. Then, when the aspiration is stopped, since the object is released from being held, the object will be in a state where the object is merely placed on the suction-attachment surface, i.e., a state suitable for moving the object to another place.

As a development of such a suction-attachment table, as described in Japanese Patent Laid-Open No. 2005-205507 (hereinafter, Patent Literature 1), a configuration has been proposed that reliably holds an object being held in a flat manner. Additionally, as described in Japanese Patent Laid-Open No. 5-344284 (hereinafter, Patent Literature 2), a configuration has also been proposed that is suitable for imaging an object held on a suction-attachment table.

SUMMARY OF INVENTION

Technical Problem

However, in the configuration described in Patent Literature 1, as shown in FIG. 4 and FIG. 5 of Patent Literature 1, there are protrusions 18a via a placement portion 11 under an object (semiconductor wafer W). Thus, when the object is pressurized from above, pressure unevenness due to pressurization will be generated in the object. To be specific, the object will receive a higher pressure at portions positioned above the protrusions 18a than the other portions due to pressurization. When such pressure unevenness is generated, the accuracy of processing by pressurizing the object is reduced. Accordingly, the configuration described in Patent Literature 1 is not suitable for pressurization.

Additionally, in the configuration described in Patent Literature 2, as shown in FIG. 3 of Patent Literature 2, a porous plate 41 on which an object (mask film) is to be placed is arranged on a flat glass plate 42. Thus, the aforementioned pressure unevenness due to pressurization is suppressed. However, in the configuration described in Patent Literature 2, aspiration is performed from a nozzle 44 attached to a side surface of the porous plate 41. Thus, the suction-attachment force by aspiration becomes higher at an outer periphery portion of the porous plate 41, which is a position close to the side surface, than the other portions, and suction-attachment unevenness is generated. In this case, the object will not be appropriately held by the porous plate 41. Accordingly, the configuration described in Patent Literature 2 is also not suitable for pressurization.

Therefore, an object of the present invention is to provide a pressurizing suction-attachment table and a pressurizing device equipped with the same that can hold an object in a state suitable for pressurization.

Solution to Problem

In order to solve the problem, a pressurizing suction-attachment table according to a first invention includes
a porous body including a suction-attachment surface on which an object can be placed,
an elastic member directly or indirectly provided to the porous body,
a frame body that supports the porous body via the elastic member,
an aspiration space formed between the porous body and the frame body, and
an aspirator capable of aspirating the aspiration space to cause the object to be suction-attached to the suction-attachment surface,
wherein the porous body incudes an opposite surface positioned on a side opposite to the suction-attachment surface,
the frame body includes a receiving surface for receiving the opposite surface when the elastic member is elastically deformed due to pressurization of the object placed on the suction-attachment surface onto the suction-attachment surface, and
when the opposite surface is received by the receiving surface, a reactive force from the porous body to the object that is being pressurized becomes uniform.

Additionally, in a pressurizing suction-attachment table according to a second invention, in the pressurizing suction-attachment table according to the first invention, each of the opposite surface of the porous body and the receiving surface of the frame body that receives the opposite surface is flat,
the frame body includes an aspiration opening formed at a position other than the receiving surface and communicating with the aspiration space, and
the aspirator is connected to the aspiration opening.

Further, in a pressurizing suction-attachment table according to a third invention, the porous body in the pressurizing suction-attachment table according to the first or second invention includes side surfaces, and
the side surfaces and the opposite surface of the porous body face the aspiration space.

Additionally, in a pressurizing suction-attachment table according to a fourth invention, the elastic member in the pressurizing suction-attachment table according to the first or second invention is a member integral with the frame body and attached to the porous body.

Additionally, in a pressurizing suction-attachment table according to a fifth invention, the frame body in the pressurizing suction-attachment table according to the first or second invention includes a support member attached to the porous body, and
the elastic member is a spring and/or rubber for connecting the support member and the receiving surface of the frame body.

Additionally, in a pressurizing suction-attachment table according to a sixth invention, the porous body in the pressurizing suction-attachment table according to the first or second invention contains carbon.

Additionally, a pressurizing device according to a seventh invention includes the pressurizing suction-attachment table according to the first or second invention, and a pressurizer that pressurizes the object placed on the suction-attachment surface of the pressurizing suction-attachment table toward the suction-attachment surface.

Advantageous Effects of Invention

According to the pressurizing suction-attachment table, the object can be held in a state suitable for pressurization.

DESCRIPTION OF EMBODIMENTS

Hereinafter, pressurizing suction-attachment tables and a pressurizing device equipped with the same according to Embodiments 1 and 2 of the present invention, will be described based on the drawings. Each of the pressurizing suction-attachment tables according to Embodiments 1 and 2 of the present invention holds an object to be pressurized by suction attachment under negative pressure (aspiration).

Embodiment 1

Figure 1:
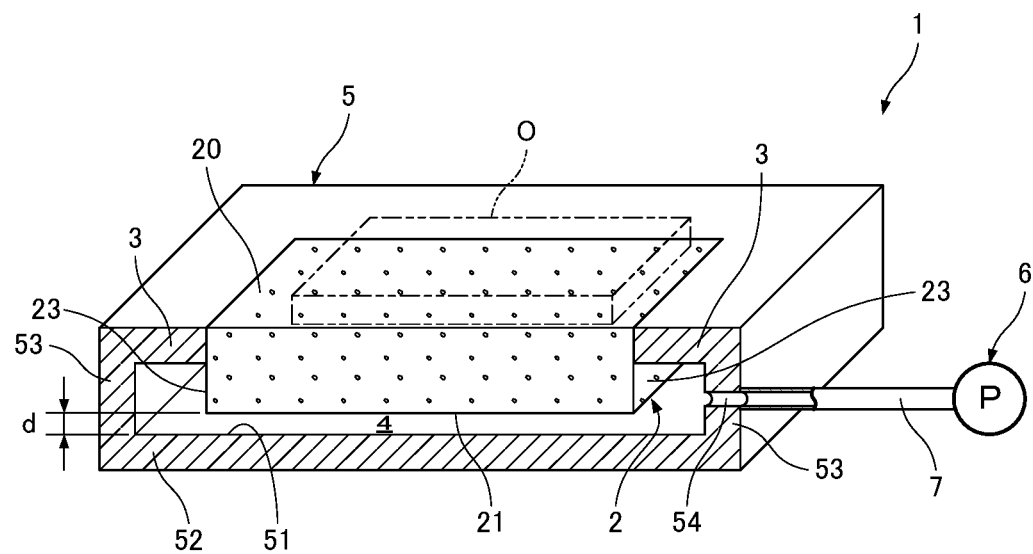
FIG. 1 is a cross-sectional perspective view of a pressurizing suction-attachment table according to Embodiment 1 of the present invention crossed in the center.
Figure 2:
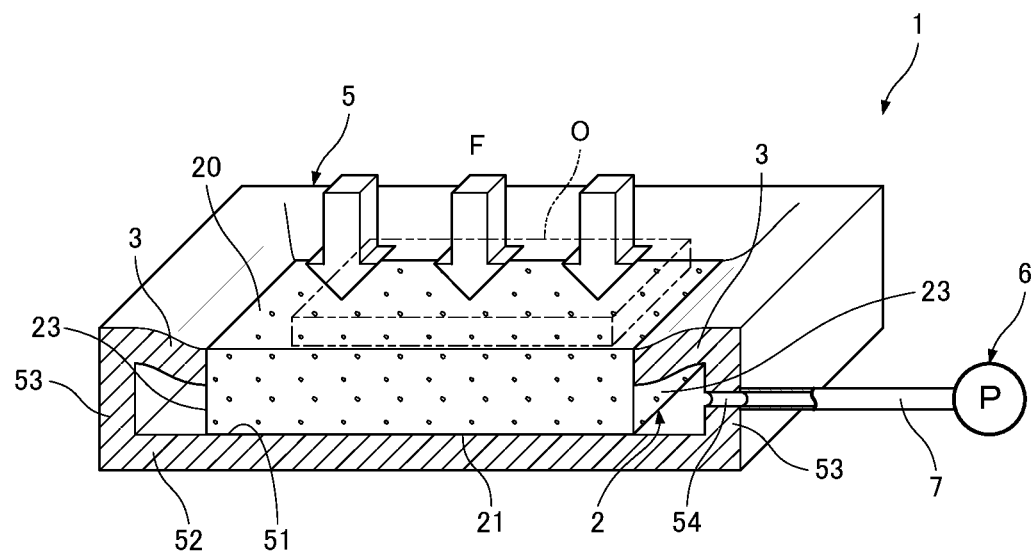
FIG. 2 is a cross-sectional perspective view showing a state where an object placed on the pressurizing suction-attachment table is pressurized.

As shown in FIG. 1, a pressurizing suction-attachment table 1 according to the present Embodiment 1 includes a porous body 2 having a suction-attachment surface 20 on which an object O can be placed, an elastic member 3 directly provided to this porous body 2, and a frame body 5 supporting the porous body 2 via this elastic member 3. An aspiration space 4 is formed between the porous body 2 and the frame body 5. Additionally, the pressurizing suction-attachment table 1 includes an aspirator 6 capable of aspirating the aspiration space 4 to cause the object O to be suction-attached to the suction-attachment surface 20. The porous body 2 includes an opposite surface 21 positioned on a side opposite to the suction-attachment surface 20. As shown in FIG. 2, the frame body 5 includes a receiving surface 51 for receiving the opposite surface 21 when the elastic member 3 is elastically deformed due to pressurization of the object O placed on the suction-attachment surface 20 toward the suction-attachment surface 20. The pressurizing suction-attachment table 1 is configured such that, when the opposite surface 21 is received by the receiving surface 51, a reactive force from the porous body 2 to the object O that is being pressurized becomes uniform.

The porous body 2 is not particularly limited as long as the porous body 2 includes the suction-attachment surface 20 and the opposite surface 21, forms the aspiration space 4 between the porous body 2 and the frame bodies 5, and applies the uniform reactive force to the object O when received by the receiving surface 51 of the frame body 5 as shown in FIG. 1. Additionally, the porous body 2 is made of a material (ceramics or the like) having a large number of holes. In Embodiment 1 of the present invention (also in Embodiment 2 described later), as a preferable mode, an example is shown in which the porous body 2 is a rectangular parallelepiped having the suction-attachment surface 20 and the opposite surface 21 as a top surface and a bottom surface, respectively, and having side surfaces 23. In this rectangular parallelepiped porous body 2, a part of the side surfaces 23 is attached to the elastic member 3, and the portions to which the elastic member 3 is not attached face the aspiration space 4. Additionally, in the porous body 2, the opposite surface 21 is flat and faces the aspiration space 4. Further, in the porous body 2, the suction-attachment surface 20 is arranged flush with the elastic member 3 and the frame body 5. Note that it is preferable that the surface roughness of the flat opposite surface 21 is 12.5 or less (Ra<=12.5).

As a preferable porous body 2 in a case where the object O is a powder material, each pore size is 50 μm or less ($\varphi$<=50 μm), or the surface roughness of the suction-attachment surface 20 is 12.5 or less (Ra<=12.5). This is because, with such a pore size or surface roughness, a surface of the powder material contacting the suction-attachment surface 20 will not be damaged even when the powder material (object O) slides and spreads due to the pressurization. Of course, it is more preferable to satisfy both the pore size and the surface roughness. Additionally, it is preferable that the porous body 2 contains carbon, and it is more preferable that the porous body 2 consists of carbon. This is because the porous body 2 accordingly functions as a cartridge at the time of electrostatic deposition of the powder material. The object O is not limited to the powder material alone, but may be a metallic foil or the like to which the powder material is suction-attached. Also in this case, since the surface roughness of the suction-attachment surface 20 is transferred to the powder material via the metallic foil by the pressurization, it is preferable that the surface roughness is 12.5 or less (Ra<=12.5).

The elastic member 3 is not particularly limited as long as the elastic member 3 is directly provided to the porous body 2, and is elastically deformed until the opposite surface 21 is received by the receiving surface 51 due to the pressurization. In Embodiment 1 of the present invention, as a preferable mode, an example is shown in which the elastic member 3 is a member integral with the frame body 5 and attached to the porous body 2. Here, an elastic coefficient E of the elastic member 3 is equal to or less than the value obtained by dividing a force F due to the pressurization (see FIG. 2) by a distance d between the opposite surface 21 and the receiving surface 51 (see FIG. 1) (E<=F/d). When such an elastic coefficient E, the elastic member 3 is elastically deformed until the opposite surface 21 is received by the receiving surface 51 due to the pressurization.

The frame body 5 is not particularly limited as long as the frame body 5 forms the aspiration space 4 between the frame body 5 and the porous bodies 2, and includes the receiving surface 51 that receives the opposite surface 21 as shown in FIG. 1. In Embodiment 1 of the present invention (also in Embodiment 2 described later), as a preferable mode, an example is shown in which the frame body 5 includes a bottom plate 52 whose top surface serves as the flat receiving surface 51, and side plates 53 rising from outer edges of this bottom plate 52. The elastic member 3 is attached to upper portions of these side plates 53. The aspiration space 4 is a space enclosed by inner surfaces of these side plates 53, the top surface (receiving surface 51) of the bottom plates 52, and the porous body 2. An aspiration opening 54 communicating with the aspiration space 4 is formed in one of these side plates 53. The aspirator 6 is connected to this aspiration opening 54 via a pipe 7, a hose, or the like. Note that it is preferable that the surface roughness of the flat receiving surface 51 is 12.5 or less (Ra<=12.5).

The aspirator 6 is not particularly limited as long as the aspirator 6 can aspirate the aspiration space 4 to cause the object O to be suction-attached to the suction-attachment surface 20, but may be, for example, an exhaust pump. This exhaust pump has sufficient performance to cause the suction-attachment surface 20 to appropriately suction-attach the object O at the time of the pressurization.

Next, a pressurizing device 100 equipped with the pressurizing suction-attachment table 1 will be described based on FIG. 3 and FIG. 4.

Figure 3:
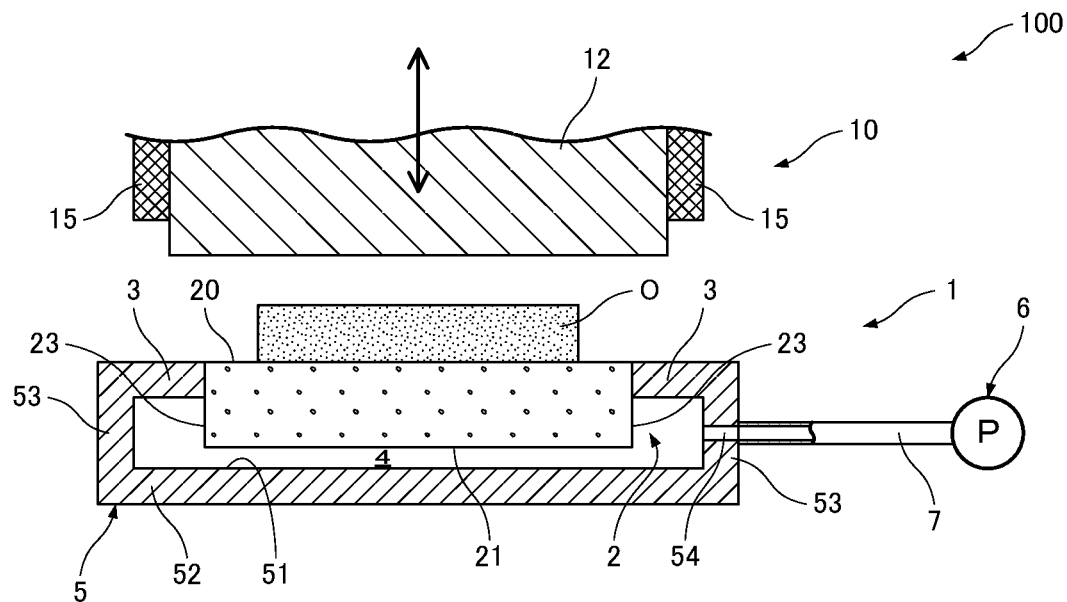
FIG. 3 is a cross-sectional view of a pressurizing device equipped with the pressurizing suction-attachment table.
Figure 4:
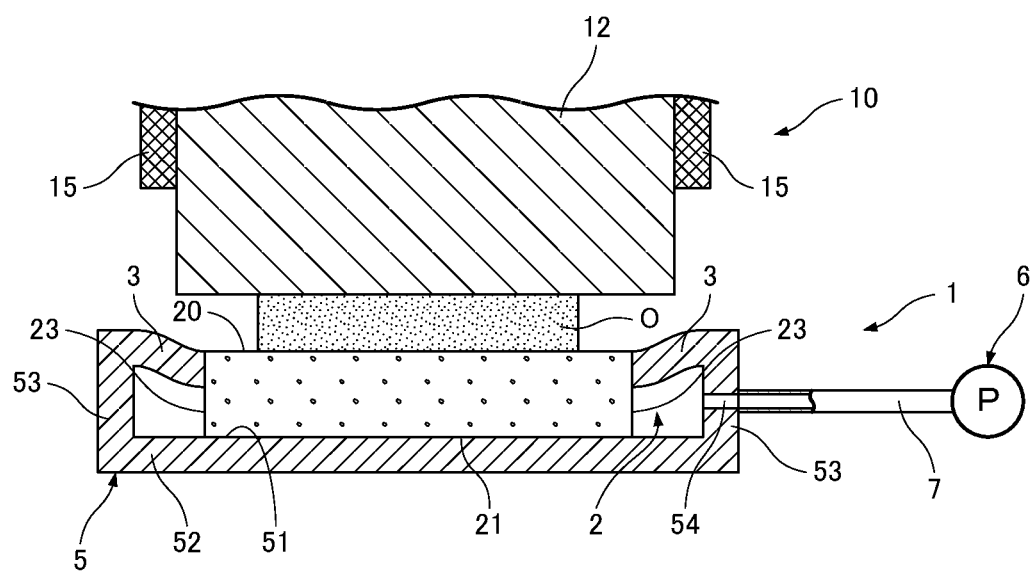
FIG. 4 is a cross-sectional view showing a state where the object is pressurized by the pressurizing device.

As shown in FIG. 3 and FIG. 4, the pressurizing device 100 includes the pressurizing suction-attachment table 1, and a pressurizer 10 that pressurizes the object O placed on the suction-attachment surface 20 of the pressurizing suction-attachment table 1 toward the suction-attachment surface 20.

The pressurizer 10 includes, for example, a fixed-type body 15 and a pressurizing pin 12 that moves in and out with respect to this body 15. In the pressurizing pin 12, a surface pressurizing the object O is parallel to the suction-attachment surface 20, and the direction in which the pressurizing pin 12 moves in and out is orthogonal to the suction-attachment surface 20.

Hereinafter, a description will be given of manufacturing methods of the pressurizing suction-attachment table 1 and the pressurizing device 100 equipped with the same.

In the manufacture of the pressurizing suction-attachment table 1, as shown in FIG. 3, the porous body 2, the elastic member 3, and the frame body 5 are connected so that the suction-attachment surface 20 of the porous body 2, the top surface of the elastic member 3, and upper end surfaces of the side plates 53 of the frame body 5 are flush. On the other hand, the aspirator 6 is connected to the aspiration opening 54 formed in the side plate 53 of the frame body 5 via the pipe 7 or the like. In this manner, the pressurizing suction-attachment table 1 is manufactured.

In the manufacture of the pressurizing device 100, as shown in FIG. 4, the pressurizer 10 is arranged with respect to the pressurizing suction-attachment table 1 so that the pressurizing pin 12 projecting from the body 15 of the pressurizer 10 is at a position for pressurizing the object O placed on the porous body 2. In this manner, the pressurizing device 100 is manufactured.

Hereinafter, a description will be given of a usage of the pressurizing suction-attachment table 1 and the pressurizing device 100 equipped with the same.

As shown in FIG. 3, a user places the object O on the suction-attachment surface 20 of the pressurizing suction-attachment table 1, and on the other hand, causes the aspirator 6 to aspirate the aspiration space 4. Accordingly, the porous body 2 is widely aspirated from the side surfaces 23 and the opposite surface 21 facing this aspiration space 4. Thus, aspiration is uniformly performed through each hole of the suction-attachment surface 20, and as a result, the object O is uniformly suction-attached to the suction-attachment surface 20. Further, since the porous body 2 is widely aspirated from the side surfaces 23 and the opposite surface 21, and thus sufficient aspiration is obtained through each hole of the suction-attachment surface 20, the object O is sufficiently suction-attached to the suction-attachment surface 20. Here, since the porous body 2 contains carbon, the porous body 2 functions as a cartridge at the time of electrostatic deposition of the powder material. Therefore, the powder material (object O) is uniformly deposited (placed), by electrostatic deposition, on a metallic foil (illustration omitted) placed on the suction-attachment surface 20 of the porous body 2. Thus, it is unnecessary to move a separately deposited powder material to the suction-attachment surface 20, and collapsing of the powder material due to such movement is prevented.

Then, as shown in FIG. 4, the user causes the pressurizer 10 to project the pressurizing pin 12 from the body 15, so as to pressurize the object O toward the suction-attachment surface 20 by the pressurizing pin 12. With this pressurization, the elastic member 3 is elastically deformed, and the opposite surface 21 of the porous body 2 is received by the receiving surface 51 of the frame body 5. At this time, a reactive force is generated from the receiving surface 51 to the object O via the porous body 2. Here, since the opposite surface 21 of the porous body 2 and the receiving surface 51 are both flat (preferably, the surface roughness is 12.5 or less), the reactive force generated from the receiving surface 51 to the object O via the porous body 2 also becomes uniform. Note that since each pore size is 50 μm or less, and/or the surface roughness of the suction-attachment surface 20 is 12.5 or less, in a case where the object O is the powder material, even when the powder material (object O) slides and spreads on the suction-attachment surface 20 due to the pressurization, high accuracy is maintained without damaging a surface of the powder material contacting the suction-attachment surface 20.

In this manner, according to the pressurizing suction-attachment table 1 and the pressurizing device 100 equipped with the same, since the object O is uniformly aspirated on the suction-attachment surface 20, and the reactive force from the porous body 2 to the object O that is being pressurized becomes uniform, the object O can be held in a state suitable for pressurization.

Additionally, since the opposite surface 21 and the receiving surface 51 are both flat (preferably, the surface roughness is 12.5 or less), and thus the reactive force is more uniformly maintained, the object O can be held in a state more suitable for pressurization.

Further, since the elastic member 3 and the frame body 5 are integral, aspiration leakage does not occur between the elastic member 3 and the frame bodies 5. As a result, since the object O is more uniformly suction-attached to the suction-attachment surface 20, the object O can be held in a state more suitable for pressurization.

Additionally, since each pore size is 50 μm or less, and/or the surface roughness of the suction-attachment surface 20 is 12.5 or less, in a case where the object O is the powder material, a surface of the powder material contacting the suction-attachment surface 20 will not be damaged, and thus it is possible to increase the accuracy of forming the object O by pressurization.

Additionally, since the porous body 2 contains carbon, and the porous body 2 functions as a cartridge at the time of electrostatic deposition of the powder material on the metallic foil, it is unnecessary to move a separately deposited powder material (the object O) to the suction-attachment surface 20. As a result, collapsing of the powder material due to such movement is prevented, and the accuracy of forming the powder material (object O) by the pressurization can be increased.

Embodiment 2

Hereinafter, a pressurizing suction-attachment table 1 according to Embodiment 2 will be described based on FIG. 5 to FIG. 8. In Embodiment 2, a description will be given focusing on the elastic member 3 and its vicinity, which have different configurations from those in Embodiment 1, the same numerals are given to the same configurations as those in Embodiment 1, and a description thereof will be omitted. Note that, for the pressurizing device 100, only the pressurizing suction-attachment table 1 equipped in the pressurizing device 100 differs between Embodiment 1 and the present embodiment 2. Accordingly, hereinafter, a description of the pressurizing device 100 will be omitted.

Figure 5:
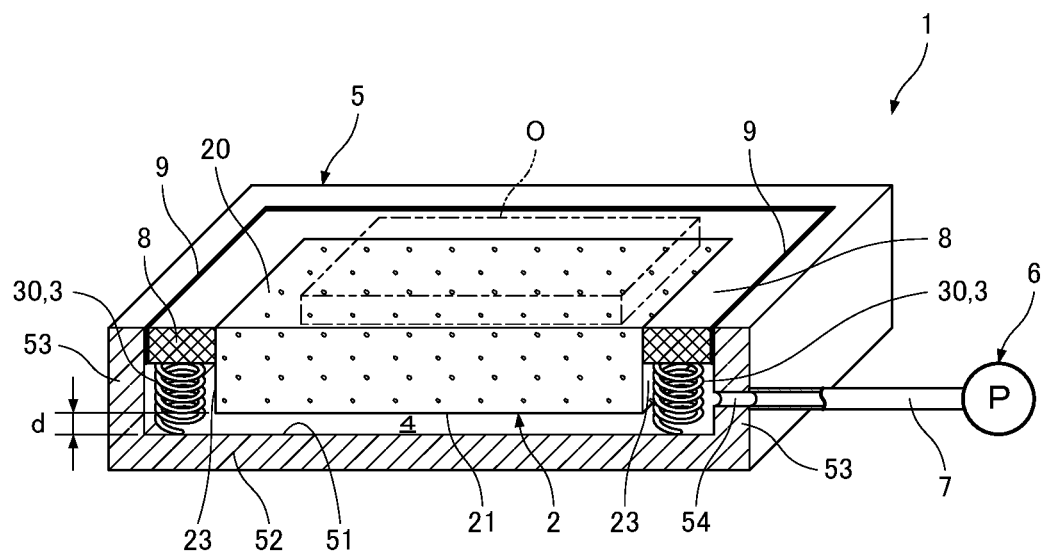
FIG. 5 is a cross-sectional perspective view of a pressurizing suction-attachment table according to Embodiment 2 of the present invention crossed in the center.
Figure 6:
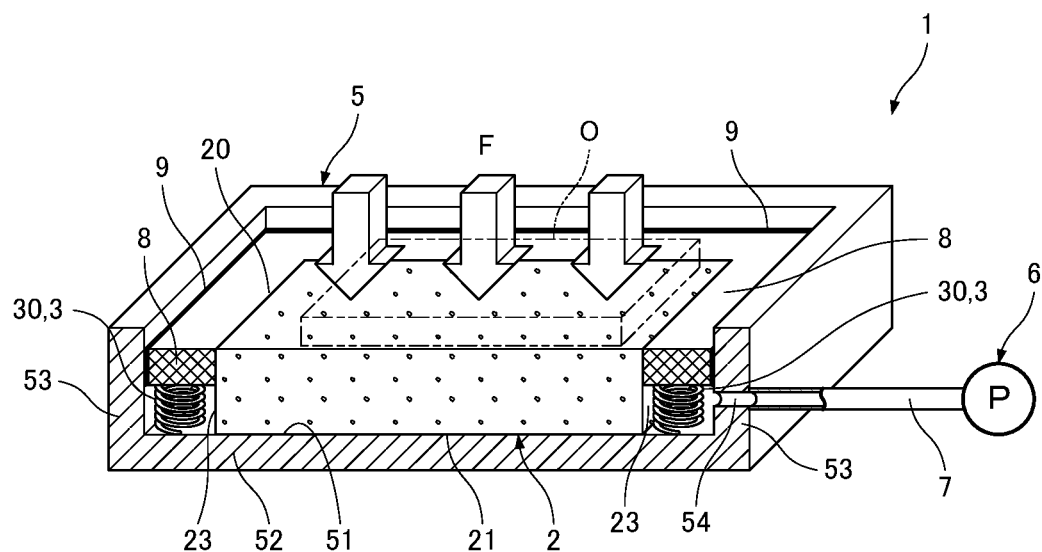
FIG. 6 is a cross-sectional perspective view showing a state where an object placed on the pressurizing suction-attachment table is pressurized.

As shown in FIG. 5 and FIG. 6, the frame body 5 of the pressurizing suction-attachment table 1 according to the present Embodiment 2 includes a support member 8 attached to the porous body 2. As shown in FIG. 5, this support member 8 is arranged to be flush with the suction-attachment surface 20 of the porous body 2. The elastic members 3 of the pressurizing suction-attachment table 1 are springs 30 and/or rubber connecting the support member 8 and the receiving surface 51 of the frame body 5. That is, the elastic members 3 (the springs 30 and/or rubber) of the pressurizing suction-attachment table 1 according to the present Embodiment 2 are provided to the porous body 2 indirectly (via the support member 8). Note that, in FIG. 5 to FIG. 8 and hereinafter, to simplify the description, the elastic members 3 will be described as the springs 30.

In Embodiment 1, the member (elastic member 3) attached to the porous body 2 is bent due to pressurization. On the other hand, in the present embodiment 2, as shown in FIG. 6, the member (support member 8) attached to the porous body 2 is not bent due to pressurization, but moves along with the porous body 2. Therefore, it is preferable to provide a sealant 9, such as an O ring, which suppresses aspiration leakage, between the side plates 53 of the frame body 5 and the support member 8.

Figure 7:
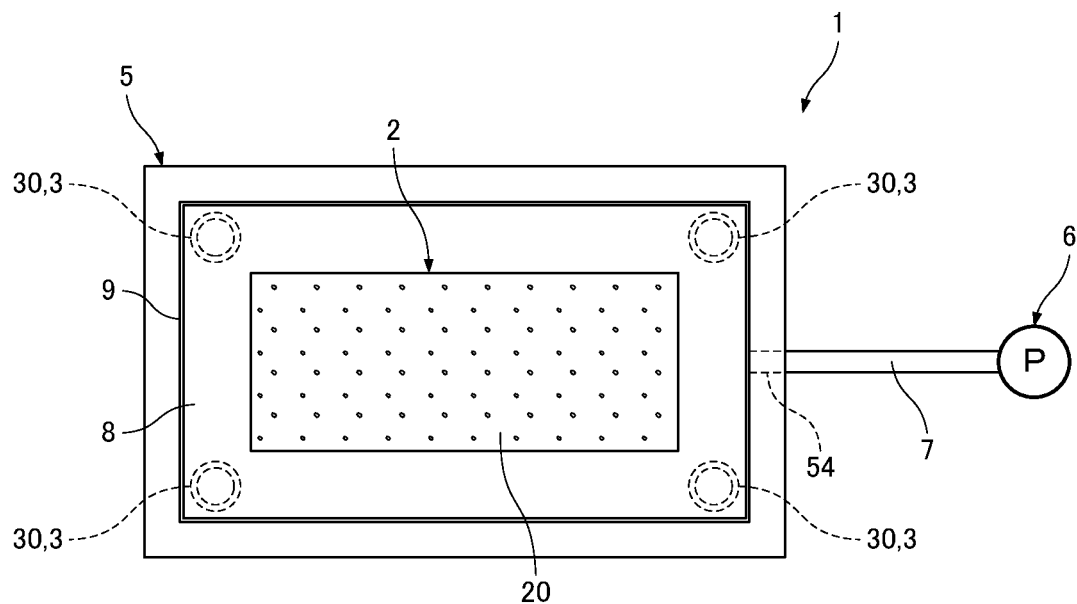
FIG. 7 is a plan view showing an arrangement of springs in the pressurizing suction-attachment table.
Figure 8:
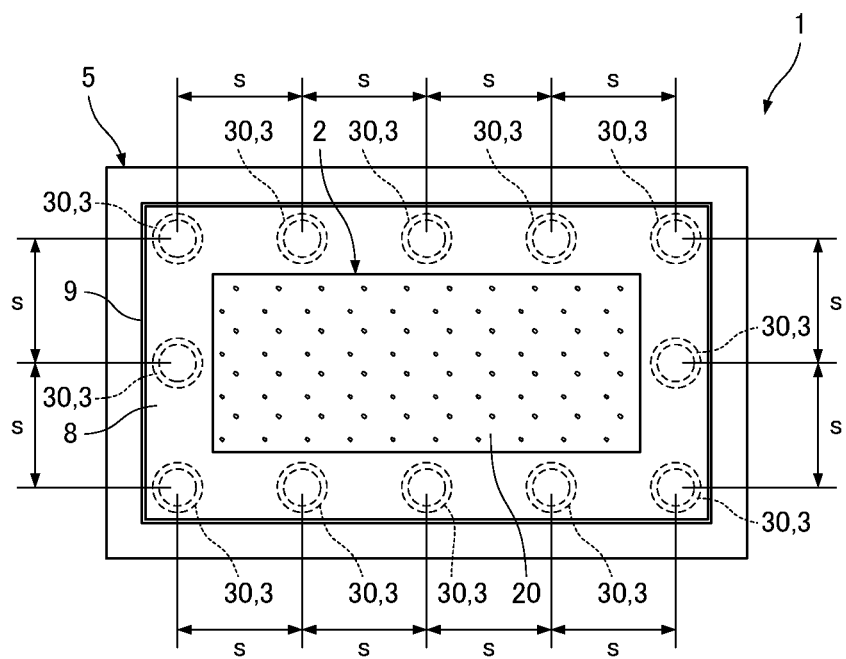
FIG. 8 is a plan view showing another arrangement of springs in the pressurizing suction-attachment table.

It is preferable that the arrangement of the springs 30 in plan view is such that the reactive force applied to the object O becomes uniform even before the opposite surface 21 is received by the receiving surface 51. Examples of this preferable arrangement are shown in FIG. 7 and FIG. 8. As an example, as shown in FIG. 7, it is preferable to arrange the springs 30 in the four corners of the support member 8 in plan view. As another example, as shown in FIG. 8, it is preferable to arrange the adjacent springs 30 at equal intervals s in plan view.

In this manner, with the pressurizing suction-attachment table 1 and the pressurizing device 100 equipped with the same according to the present Embodiment 2, the member (support member 8) attached to the porous body 2 is not bent due to pressurization, but moves along with the porous body 2. Therefore, the object O can be held in a state more suitable for pressurization.

Additionally, with the aforementioned preferable arrangement of the springs 30 (and/or rubber), the reactive force from the porous body 2 to the object O that is being pressurized becomes uniform even before the opposite surface 21 is received by the receiving surface 51. Therefore, the object O can be held in a state more suitable for pressurization.

Incidentally, although the plan view of the frame body 5 and the porous body 2 has been described as a rectangle in the aforementioned Embodiments 1 and 2, it is not limited to this, and may be other shapes such as a circle.

Figure 9:
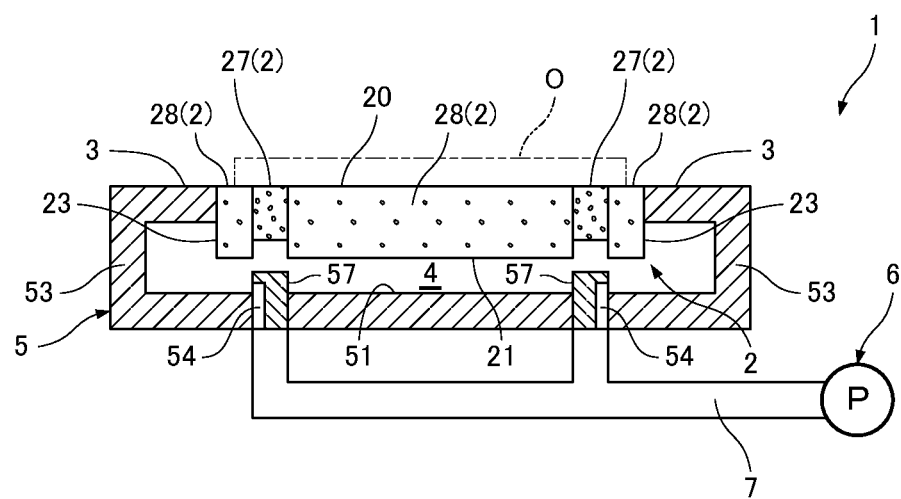
FIG. 9 is a cross-sectional view of a pressurizing suction-attachment table according to another embodiment of the present invention.

Additionally, although it has been described in the aforementioned Embodiments 1 and 2 that the opposite surface 21 and the receiving surface 51 are both flat, and the aspiration opening 54 is formed in the side plate 53 of the frame body 5, it is not limited to this. For example, as shown in FIG. 9, protrusions 57 may be formed in the receiving surface 51 of the frame body 5, and the opposite surface 21 may have a convex-concave shape that matches the receiving surface 51 (including the protrusions 57). In this case, in the porous body 2, the rigidity of portions 27 (portions having a small thickness) received by the protrusions 57 is high, and the rigidity of portions 28 (portions having a large thickness) received by the receiving surface 51 other than the protrusions 57 is low, and when the opposite surface 21 of the porous body 2 is received by the receiving surface 51, the resultant reactive force from the porous body 2 (27, 28) to the object O that is being pressurized should become uniform. Even when the rigidity of the portions 27 (portions having a small thickness) received by the protrusions 57 is low, and the rigidity of the portions 28 (portions having a large thickness) received by the receiving surface 51 other than the protrusions 57 is high, when the opposite surface 21 of the porous body 2 is received by the receiving surface 51, the resultant reactive force from the porous body 2 (27, 28) to the object O that is being pressurized should become uniform. Note that aspiration openings 54 may be formed in the protrusions 57 or the like as shown in FIG. 9, as long as the reactive force from the porous body 2 to the object O that is being pressurized becomes uniform.

Further, the aforementioned Embodiments 1 and 2 are illustrative in all respects, and not restrictive. The scope of the present invention is not indicated by the aforementioned description but by the claims, and it is intended to include all modifications within the meaning and scope of the claims and equivalents. Among the configurations described in the aforementioned embodiments and examples, the configurations other than the configuration set forth as the first invention in "Solution to Problem" are any configurations, and can be appropriately omitted or modified.

The invention claimed is:

1. A pressurizing suction-attachment table, comprising:
    a porous body including a suction-attachment surface on which an object can be placed;
    an elastic member directly or indirectly provided to the porous body;
    a frame body that supports the porous body via the elastic member;
    an aspiration space formed between the porous body and the frame body; and
    an aspirator capable of aspirating the aspiration space to cause the object to be suction-attached to the suction-attachment surface, wherein the porous body includes an opposite surface positioned on a side opposite to the suction-attachment surface, wherein the frame body includes a receiving surface for receiving the opposite surface when the elastic member is elastically deformed due to pressurizing the object placed on the suction-attachment surface toward the suction-attachment surface, wherein the elastic member is configured to be elastically deformed such that the opposite surface of the porous body comes into direct contact with the receiving surface of the frame body when the object on the suction-attachment surface is pressurized toward the suction-attachment surface, and wherein when the opposite surface is received by the receiving surface, a reactive force from the porous body to the object that is being pressurized becomes uniform.

2. The pressurizing suction-attachment table according to claim 1, wherein each of the opposite surface of the porous body and the receiving surface of the frame body receiving the opposite surface is flat, wherein the frame body includes an aspiration opening formed at a position other than the receiving surface and communicating with the aspiration space, and wherein the aspirator is connected to the aspiration opening.

3. The pressurizing suction-attachment table according to claim 1, wherein the porous body includes side surfaces, and wherein the side surfaces and the opposite surface of the porous body face the aspiration space.

4. The pressurizing suction-attachment table according to claim 1, wherein the elastic member is a member integral with the frame body and attached to the porous body.

5. The pressurizing suction-attachment table according to claim 1, wherein the frame body includes a support member attached to the porous body, and wherein the elastic member is a spring and/or rubber for connecting the support member and the receiving surface of the frame body.

6. The pressurizing suction-attachment table according to claim 1, wherein the porous body contains carbon.

7. A pressurizing device, comprising:

the pressurizing suction-attachment table according to claim 1; and a pressurizer that pressurizes the object placed on the suction-attachment surface of the pressurizing suction-attachment table toward the suction-attachment surface.

* * * * *